United States Patent [19]

Mihara et al.

[11] Patent Number: 5,447,598

[45] Date of Patent: Sep. 5, 1995

[54] PROCESS FOR FORMING RESIST MASK PATTERN

[75] Inventors: Satoru Mihara, Yokohama; Kouji Nozaki, Kawasaki; Yukari Mihara, Yokohama, all of Japan

[73] Assignee: Fujitsu Limited, Kawasaki, Japan

[21] Appl. No.: 109,108

[22] Filed: Aug. 19, 1993

Related U.S. Application Data

[63] Continuation of Ser. No. 823,618, Jan. 21, 1992, abandoned, which is a continuation of Ser. No. 431,108, Nov. 3, 1989, abandoned.

[30] Foreign Application Priority Data

| Nov. 4, 1988 [JP] | Japan | 63-279612 |
| Feb. 25, 1989 [JP] | Japan | 1-44370 |
| Jun. 16, 1989 [JP] | Japan | 1-152309 |

[51] Int. Cl.$^6$ .................................................. C03C 15/00
[52] U.S. Cl. ............................... 216/46; 437/228; 216/38; 216/67; 216/47
[58] Field of Search ............... 437/225, 228, 229; 156/646.1, 666.1

[56] References Cited

U.S. PATENT DOCUMENTS

| 4,361,114 | 11/1982 | Gurev | 427/571 |
| 4,462,882 | 7/1984 | Horwitz . | |
| 4,681,653 | 7/1987 | Purdes et al. | 427/569 |
| 4,683,838 | 8/1987 | Kimura et al. | 118/723 |
| 4,702,795 | 10/1987 | Douglas | 437/919 |

FOREIGN PATENT DOCUMENTS

| 0123813 | 11/1984 | European Pat. Off. . |
| 0202907 | 11/1986 | European Pat. Off. . |
| 87/02626 | 5/1987 | European Pat. Off. . |
| 2408913 | 6/1979 | France . |

OTHER PUBLICATIONS

Wolf, Silicon Processing for the VLSI Era, vol. 1, pp. 423–424, Lattice Press, 1986.

Coburn, Plasma-Assisted Etching, Plasma Chemistry and Plasma Processing, vol. 2, No. 1, 1982, pp. 1–6.

Primary Examiner—R. Bruce Breneman
Attorney, Agent, or Firm—Armstrong, Westerman, Hattori, McLeland and Naughton

[57] ABSTRACT

A process for forming a resist mask pattern includes the steps of forming a resist layer of organic material in a multilevel resist process on a layer to be etched, and selectively etching a planarizing lower layer used in the resist layer by using an etching gas of oxygen under a plasma condition, in which a compound gas of at least one element selected from the group consisting of B, Si, Ti, Al, Mo, W and S is added to the etching gas. For example, the compound gas comprises $BCl_3$, $BH_3$, $TiCl_4$, $S_2Cl_2$, $SiCl_4$ or the like. During the etching, a compound oxide, e.g., $B_2O_3$, $SiO_2$ or the like, is deposited on sidewalls of the lower layer to form a protective layer which prevents undercutting.

15 Claims, 6 Drawing Sheets

PROCESS FOR FORMING RESIST MASK PATTERN

This is a continuation of Ser. No. 07/823,618 filed Jan. 21, 1992 now abandoned; which is a continuation of parent application Ser. No. 07/431,108 filed Nov. 3, 1989, now abandoned.

BACKGROUND OF THE INVENTION

1. Field of the Invention

The present invention relates to a method of forming a resist (mask) pattern of organic material in a lithographic process, and more particularly, to a multilevel resist process for accurately forming a resist pattern, which pattern is used in the fine patterning of semiconductor devices (e.g., ICs) during fabrication.

2. Description of the Related Art

Resist patterns are indispensable to the fabrication of semiconductor devices, such as LSI and VLSI, and in particular, to the patterning (selective etching) of layers such as insulating layers, conductive (e.g., metal) layers, and a semiconductor layer. Recent demands for a further miniaturization of the semiconductor elements of the semiconductor device have brought a corresponding demand for finer resist patterns, for example, a resist pattern having a minimum width of less than 1 $\mu$m, i.e., a submicron pattern.

Where a multilayer structure is formed on a semiconductor substrate during the fabrication of a semiconductor device, an insulating layer or metal layer has steps having a height of approximately 1 to 2 $\mu$m, and in this case, it is very difficult to accurately form a fine pattern on the insulating or metal layer by a single-layer resist process. Therefore, to accurately form a fine pattern on a stepped layer, multilevel resist processes, including a trilevel resist process and a bilevel resist process, have been proposed.

A conventional trilevel resist process is now explained with reference to FIGS. 1A to 1D and FIG. 2.

Figure 1A:
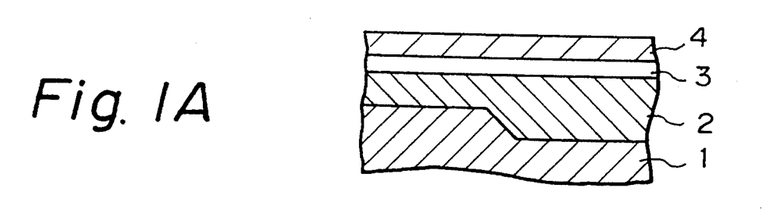
FIGS. 1A to 1D are schematic sectional views of a layer to be etched and a triple layer structure thereon, in various stages of a trilevel resist process.

A resist (mask) pattern is formed in accordance with a conventional trilevel resist process in the following manner. As shown in FIG. 1A, on a layer 1, which is to be selectively etched (patterned) and has a step caused by an underlying layer (not shown) formed on a semiconductor layer, and which is, e.g., an aluminum (Al) layer, a planarizing layer (thick lower layer) 2 of organic material is formed to cover the step and provide a flat surface thereon. The planarizing layer 2 has a thickness greater than the height of the step, and the organic material is a resin which can be easily etched by oxygen plasma, such as phenolic novolak and cresylic novolak, and may or may not be photosensitive. Then an intermediate (isolation) layer 3 having a high resistance to oxygen dry etching is formed on the planarizing layer 2. The intermediate layer 3 is made of, e.g., silicon oxide (SiO$_2$), silicon nitride (Si$_3$N$_4$) or the like, and thereafter, a thin imaging resist layer (upper layer) 4 for pattern formation is formed on the intermediate layer 3.

Figure 1B:
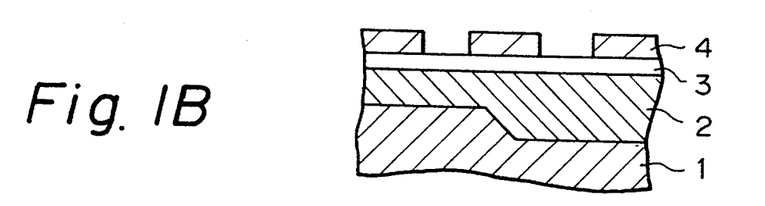
Figure 1C:
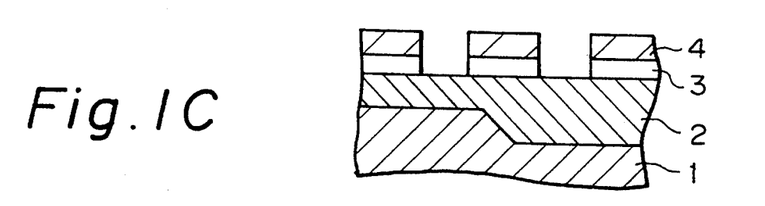
Figure 1D:
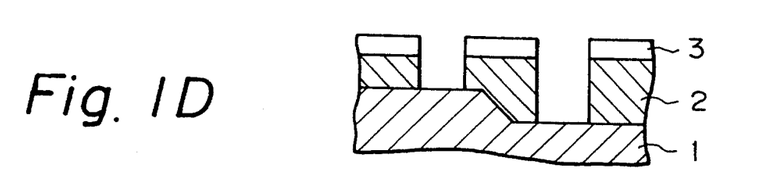
Figure 2:
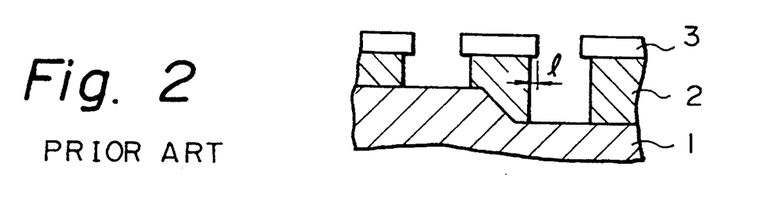
FIG. 2 is a schematic sectional view of a completed resist mask pattern according to the prior art.

As shown in FIG. 1B, the resist layer 4 is exposed and developed by using an optical, electron-beam or X-ray lithography process to shape the layer 4 into a predetermined pattern, and since the resist layer 4 is thin, a high resolution pattern of an exposure technique used can be obtained. Then, using the upper resist layer 4 as a mask as shown in FIG. 1C, the intermediate layer 3 is selectively etched by a dry anisotropic etching method, such as a reactive-ion etching (RIE) method, to shape the layer 3 into the predetermined pattern. Next, as shown in FIG. 1D, using the intermediate layer 3 as a mask, the planarizing lower layer 2 is selectively etched by a dry anisotropic etching method using an oxygen etching gas, e.g., an RIE process under oxygen plasma, to shape the layer 2 into the predetermined pattern. In practice, however, an undercutting having a width "l" appears under the edge portion of the intermediate layer 3, as shown in FIG. 2, since not only a main vertical etching component but also an oblique etching component are generated, and the latter causes side-etching. Accordingly, the dimensions of the obtained resist mask pattern are not aligned with the originally predetermined pattern dimensions. When the layer (Al layer) 1 to be etched is dry-etched by using the obtained planarizing lower layer 2 as a mask, the layer 1 is patterned in accordance with the obtained lower layer 2 having the misaligned dimension, and therefore, the obtained resist mask pattern cannot provide a satisfactorily fine and accurate patterning.

Figure 3A:
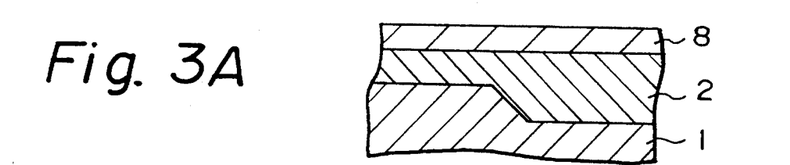
FIGS. 3A to 3C are schematic sectional views of a layer to be etched and a double layer structure thereon, in various stages of a bilevel resist process.
Figure 3B:
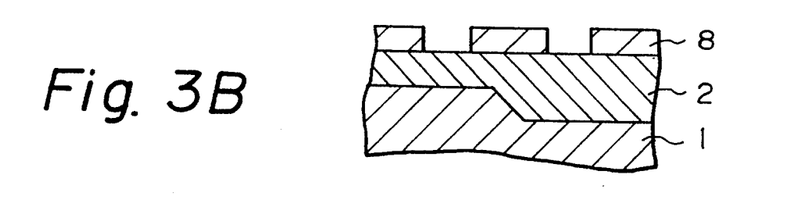
Figure 3C:
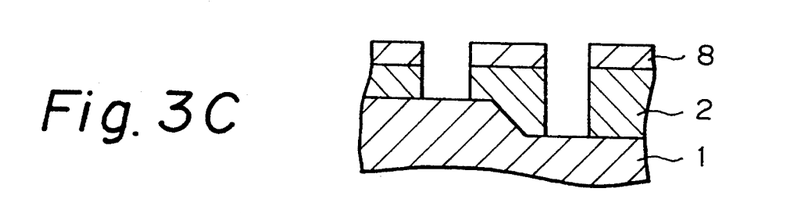
Figure 4:
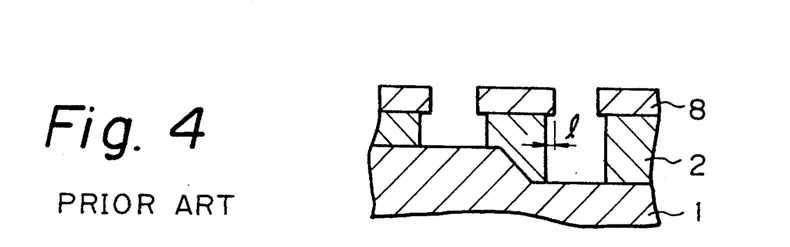
FIG. 4 is a schematic sectional view of a completed resist mask pattern according to the prior art.

A resist (mask) pattern is formed by a conventional bilevel resist process in the following manner. As shown in FIG. 3A, on a stepped layer (e.g., Al layer) 1 to be selectively etched, a planarizing layer (thick lower layer) 2 of the above-mentioned organic material is formed to cover the step and to form a flat surface. Then an upper resist layer 8 serving as the intermediate layer and the upper resist layer used in the trilevel resist process is formed on the planarizing lower layer 2. The upper resist layer 8 is of, e.g., photosensitive silicon-containing resin. Then, as shown in FIG. 3B, the upper resist layer 8 is exposed and developed by a suitable lithography technique to shape the layer 8 into a predetermined pattern. Next, as shown in FIG. 3C, using the upper resist layer 8 as a mask, the planarizing lower layer 2 is selectively etched (patterned) by a dry anisotropic plasma RIE process, to shape the layer 2 into the predetermined pattern. In practice, however, as shown in FIG. 4, an undercutting having a width "l" appears in the same manner as in the above-mentioned trilevel resist process case, and thus the dimensions of the obtained resist mask pattern are not aligned with the originally predetermined dimension. Therefore, the obtained planarizing lower layer 2 cannot provide a satisfactorily fine and accurate patterning.

Figure 5:
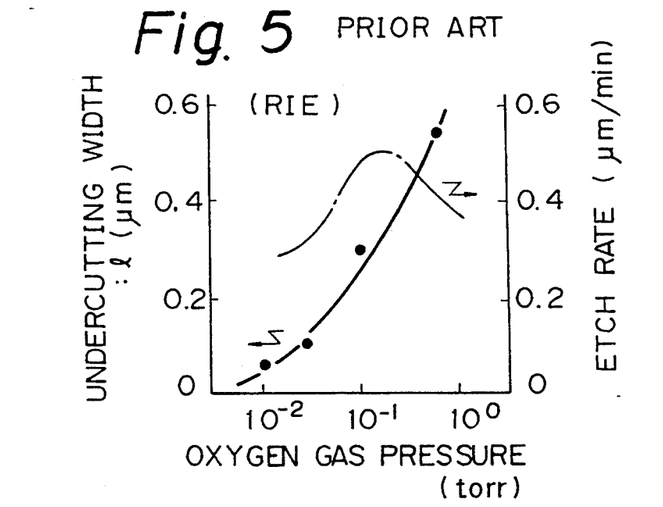
FIG. 5 is a graph showing undercutting widths and etching rates of the planarizing lower layer in accordance with the oxygen gas pressure in an RIE apparatus.

For example, a planarizing lower layer of novolak (OFPR-800: trade name of product manufactured by Tokyo-Ohka Kogyo Kabushiki Kaisha, Japan), an intermediate layer of SiO$_2$ and an upper resist layer of the same novolak were, in sequence, formed on a substrate to form a trilevel resist structure. After the exposure and development of the upper layer, and selective etching of the intermediate layer, the lower layer was selectively etched (patterned) under a generation of oxygen plasma in a parallel-plate type RIE apparatus using oxygen gas as an etchant gas, and the results shown in FIG. 5 were obtained. As can be seen from FIG. 5, the lower the oxygen gas pressure, the smaller the undercutting width "l"; but the undercutting does not disappear. On the other hand, as the oxygen gas pressure is decreased, the etching rate of the lower layer is increased to a peak value and then decreased to a relatively small value.

Figure 6:
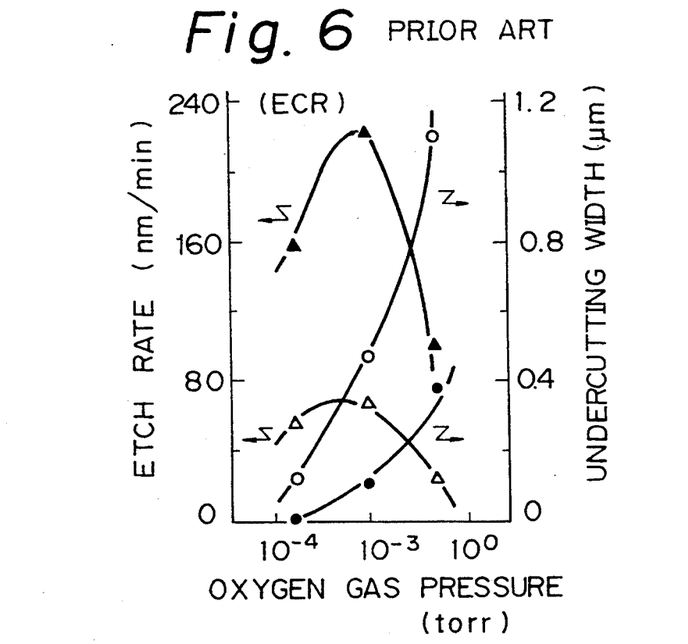
FIG. 6 is a graph showing undercutting widths and etching rates of the planarizing lower layer in accordance with the oxygen gas pressure in an ECR etching apparatus.

Instead of the RIE method, another plasma etching method utilizing an electron cyclotron resonance (ECR) effect can be used. The ECR etching method is performed at an oxygen gas pressure lower than that of the RIE method, and carries out a dry etching having a directionality stronger that of the RIE anisotropic etching. Accordingly, the ECR etching method carries out an anisotropic etching with less undercutting. The above-mentioned planarizing lower layer was selectively etched under a generation of oxygen plasma in an ECR etching apparatus using oxygen gas, and the results shown in FIG. 6 were obtained. In FIG. 6, black circles "●" and black triangles "▲" indicate the undercut width and etching rate, respectively, under a condition that a high-frequency bias is applied to a holder for substrates of the ECR etching apparatus, and white circles "○" and white triangles "△" indicate the undercutting width and etching rate, respectively, when a bias is not applied to the holder. As can be seen from FIG. 6, the bias condition is preferable to the non-bias condition, and a lower oxygen gas pressure (i.e., vacuum pressure) reduces the under-cutting width. Namely, at a pressure of $3 \times 10^{-4}$ Torr the under-cut almost disappears, but the etching rate is 160 nm/min, which is too low and is not practical.

As mentioned above, in the conventional multilevel resist process, a mask pattern (a planarizing lower layer pattern) formed in accordance with a conventional multilevel resist process has an undercut portion, and this pattern is unsatisfactory for a fine and accurate patterning of the layer under the mask pattern.

From the point of view of preventing undercutting during an anisotropical etching process, when silicon, polycrystalline silicon or tungsten silicide ($WSi_x$) is selectively and anisotropically etched, the etching gas includes carbon halide (e.g., $CCl_4$, $CF_4$ and the like) gas. The carbon halide gas is decomposed to form a carbon layer (i.e., adsorbed carbon) on sidewalls of, e.g., the polycrystalline silicon layer, to prevent the undercutting (lateral etching). This carbon layer is deposited on the exposed surface but is removed by ion bombardment. Nevertheless, the carbon sidewall protection can not be used for the anisotropical etching of organic material. In particular, if fluorocarbon (e.g., $CF_4$) gas is added to the etching gas, the neutral active species of oxygen are increased, which tends to increase the undercutting of the organic material layer compared with the use of the etching gas of oxygen only.

SUMMARY OF THE INVENTION

An object of the present invention is to provide an improved multilevel resist process in which a planarizing lower layer is pattern etched (selectively etched) without reducing an etching rate of the lower layer while preventing or minimizing undercutting.

Another object of the present invention is to accurately form a resist mask pattern with a high-resolution.

These and other objects of the present invention are attained by providing a multilevel resist process of forming a resist mask pattern, including steps of forming a resist layer of organic material (a planarizing lower layer) on a layer to be etched, and selectively etching the resist layer by using an etching gas of oxygen under a plasma condition, characterized in that a compound gas of at least one element selected from the group consisting of B, Si, Ti, Al, Mo, W, and S is added to the etching gas.

Gases of the following compounds are used as the compound gas, individually or in any combination thereof: boron compounds, such as $BCl_3$, $BH_3$, $B_2H_6$, $BF_3$ and $BBr_3$; metal compounds, such as $TiCl_4$, $AlCl_3$, $AlBr_3$, $AlI_3$, $MoCl_4$ and $WF_6$; sulfur compounds, such as $SO_2$, $S_2Cl_2$ and $SCl_2$; and silicon halides, such as $SiF_4$, $CiCl_4$ and $SiBr_4$. Preferably, the compound gas ratio to the total of the oxygen and the compound gas is from 2 to 50%, more preferably from 10 to 30%, which is suitably defined by taking into consideration the etching apparatus (RIE apparatus or ECR etching apparatus) used, the composition of the added compound gas, and the etching conditions, i.e., gas pressure, applied power, and temperature.

The oxygen gas and the compound gas are decomposed under a plasma generation condition within the etching apparatus into active species, ions and radicals of O, B, Cl, Si, F, Al or the like. The atomic oxygen rapidly converts organic material of the planarizing lower layer (and a resist upper layer) to volatile by-products such as CO, $CO_2$ and $H_2O$, to thereby etch the lower layer. Simultaneously, the generated active species, ions and radicals react with each other to form oxides such as $B_2O_3$, $SiO_2$, and $Al_2O_3$, which are deposited on the sidewalls of the lower layer to serve as a protective layer for the sidewalls. For example, the following reaction formulae are obtained:

This protective layer prevents or minimizes the undercutting (lateral etching). The oxide is also deposited on the top surface but is removed by ion bombardment, and since the ion bombardment of the sidewalls is very weak, the deposited oxide is not removed.

At less than 2% of the compound gas, the formation of the oxide protective layer on the sidewalls is not satisfactory, whereas at more than 2% of the compound gas, an etching rate of the organic material is greatly reduced and the etching effect is lowered.

Preferably, water vapor ($H_2O$) is added to the etching gas of oxygen and compound gas at a rate of 1 to 20 vol % to the total volume of the etching gas. The water vapor is easily decomposed in the plasma, to accelerate a deposition of the oxide protective layer. Where the water vapor is less than 1%, the acceleration effect is small, but where it is more than 20%, the etching rate of the organic material is greatly reduced.

BRIEF DESCRIPTION OF THE DRAWINGS

The present invention will be more apparent from the description of the preferred embodiments set forth below, with reference to the accompanying drawings, in which.

DETAILED DESCRIPTION OF THE PREFERRED EMBODIMENTS

EXAMPLE 1

As shown in FIG. 1A, a stepped aluminum (Al) layer (layer to be etched) 1 is formed on a silicon substrate (not shown), and planarizing lower layer 2 of novolak resist (OFPR-800) 2 μm thick is applied by a spin-coating method to cover the Al layer 1 and prebaked at 200° C. for 30 minutes, to form a flat surface. An intermediate layer 3 of siloxane resin (OCD-type 7; trade name of product manufactured by Tokyo-Ohka Kogyo Kabushiki Kaisha) and 300 nm thick is applied on the lower layer 2 by a spin-coating method and is baked at 250° C. for 30 minutes. Furthermore, a resist upper layer 4 of the novolak resist (OFPR-800) and 1 μm thick is applied on the intermediate layer 3 by a spin-coating method and is baked at 200° C. for 30 minutes.

Next, a light is made incident on the resist upper layer 4 through a photomask having a predetermined pattern, and the pattern is developed by an alkaline developer solution (NMD-3; trade name of product manufactured by Tokyo-Ohka Kogyo Kabushiki Kaisha), to form the layer in accordance with the predetermined pattern, as shown in FIG. 1B.

Then, using the patterned upper layer 4 as a mask, the intermediate layer 3 is selectively etched by an RIE process using a gas mixture of CF$_4$ and CHF$_3$, as shown in FIG. 1C.

Figure 7:
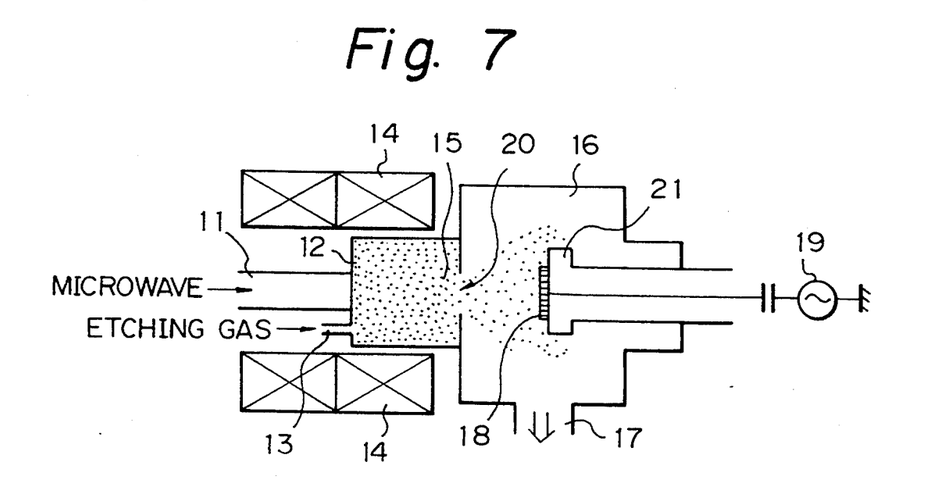
FIG. 7 is a schematic view of an ECR etching apparatus.
Figure 8:
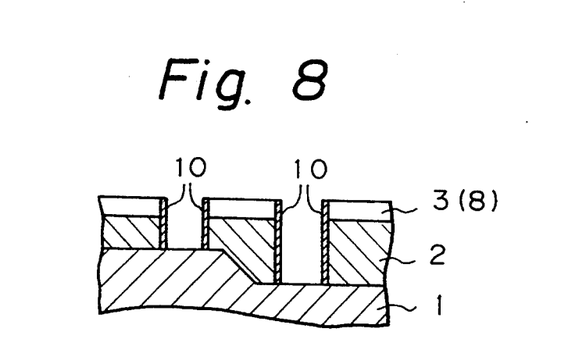
FIG. 8 is a schematic sectional view of a completed resist mask pattern formed in accordance with the process of the present invention.

Next, according to the present invention, using the patterned intermediate layer 3 as a mask, the planarizing lower layer 2 is selectively etched in an ECR etching apparatus (FIG. 7), using an etching gas of oxygen gas and a compound gas of BCl$_3$, and as shown in FIG. 8, a B$_2$O$_3$ protective layer 10 is deposited on the side walls of the layers 2 and 3.

In the ECR etching apparatus shown in FIG. 8, microwave radiation (at a frequency of 2.45 GHz) is introduced into a plasma generation chamber 12 through a waveguide 11 and a silica glass window of the chamber, the etching gas (O$_2$+BCl$_3$) is fed into the chamber 12 through an inlet pipe 13, and a magnetic field is generated by a magnetic coil 14 surrounding the chamber 12, to generate a lower pressure plasma 15 in the chamber 12. An etching chamber 16 is evacuated by a vacuum pump (not shown) through an exhaust pipe 17 to maintain a required vacuum condition therein, and a substrate 18, whereon the lower layer 2 is covered with the patterned upper and intermediate layers 4 and 3, is held on a support 21 within the chamber 16 and is biased with a radio frequency (RF) power (200 kHz) from a power source 19. Under the above conditions, the plasma 15 flows through an opening 20 from the plasma generation chamber 12 and impinges on the substrate 18 so that the lower layer 2 is selectively etched and the upper layer 4 is completely etched.

The ECR etching apparatus is operated under the following conditions, to selectively etch (pattern) the planarizing lower layer 2:

Etching gas: O$_2$ and BCl$_3$
Flow rate of etching gas: 10 cc/min (O$_2$+BCl$_3$)
Pressure in etching chamber: $5 \times 10^{-3}$ Torr
Substrate temperature: 100° C.
(Support water-cooled at 20° C.)
Microwave power: 1 kW (2.45 GHz)
RF bias: 30 W (200 kHz)

Figure 9:
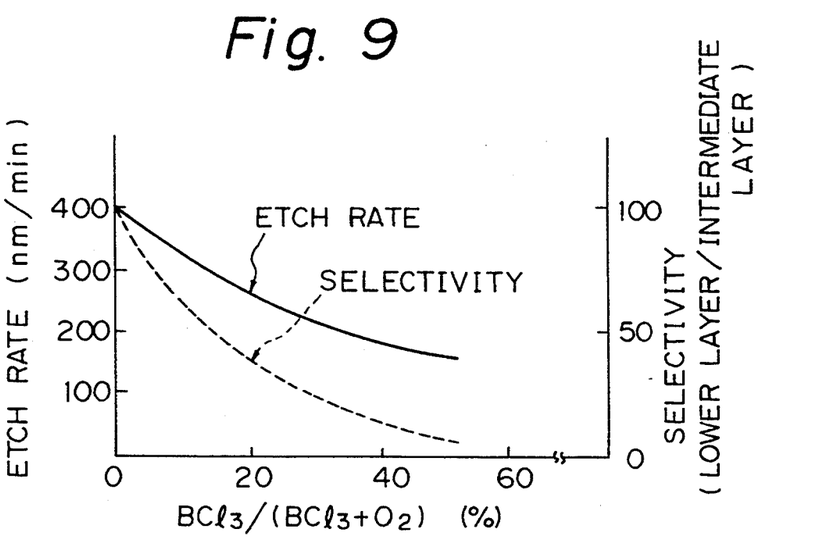
FIG. 9 is a graph showing the etching rate of the lower layer and the selectively of two layers in relation to the ratio of BCl$_3$ to the total gas.
Figure 10:
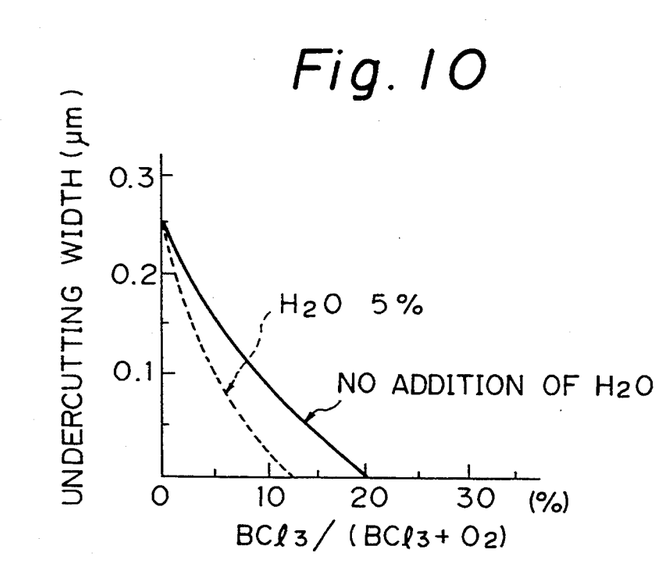
FIG. 10 is a graph showing the undercutting width of the lower layer in relation to the ratio of BCl$_3$ to the total gas.
Figure 11:
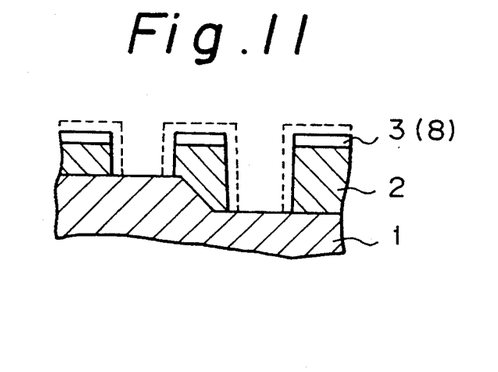
FIG. 11 is a schematic sectional view of a completed resist mask pattern over-etched in a comparison mode.

A parameter of a ratio of BCl$_3$ to the total of O$_2$ and BCl$_3$ [BCl$_3$/(O$_2$+BCl$_3$)] was varied and etching treatments were carried out to obtain the results shown in FIGS. 9 and 10. FIG. 9 shows the etching rate of the lower layer and selectivity, i.e., ratio of etching rate of the lower layer to that of the intermediate layer, which is decreased as the BCl$_3$ ratio is increased. FIG. 10 shows the undercutting width of the lower layer, which is decreased as the BCl$_3$ ratio is increased. When an etching gas of oxygen only was used, the undercutting appears as shown in FIG. 2, but when an etching gas of 20% BCl$_3$ gas and 80% oxygen gas was used, the B$_2$O$_3$ protective layer 10 was formed on the sidewalls, without the undercutting of the lower layer 2 and the lateral etching of the intermediate layer 3, as shown in FIG. 8. Namely, the protective layer prevented the undercutting and lateral etching. During the etching treatment, B$_2$O$_3$ was also deposited on the top surface but was later removed by ion bombardment. Since the B$_2$O$_3$ layer deposited on the sidewalls was slightly removed by minor ion bombardment in an oblique direction, the growth and the removal of the B$_2$O$_3$ layer were balanced, and thus the patterned lower layer was provided with an accurate vertical edge profile. On the other hand, when the BCl$_3$ ratio was over 50%, the selectivity dropped below 10; namely, the intermediate layer 3 was also etched as shown in FIG. 11. Thus the edges of the intermediates were shifted backward, which involved the undercutting (lateral etching) of the lower layer. For example, the line width of the patterned resist mask (layers 2 and 3) was reduced by 100 to 200 nm at one side. The superior anisotropic etching with little undercutting and lateral etching (mask edge shift) was performed in the range of a BCl$_3$ gas ratio of from 10 to 40%, where the etching gas pressure was set at $8 \times 10^{-3}$ Torr, a superior anisotropic etching was obtained in the range of a BCl$_3$ gas ratio of from 20 to 50%, and at a pressure of $7 \times 10^{-4}$ Torr, a superior etching was obtained in the range of a BCl$_3$ gas ratio of from 5 to 30%.

Thereafter, using the obtained mask pattern of the layers 2 and 3 as a mask, the Al layer 1 was etched by an RIE process using a suitable etching gas (e.g., gas mixture of BCl$_3$, Cl$_2$ and SiCl$_4$) to form an Al pattern (Al conductive lines) having accurate predetermined dimensions.

EXAMPLE 2

In the trilevel resist process explained in Example 1, during the anisotropic etching of the planarizing lower layer 2 in the ECR etching apparatus, water vapor (H$_2$O) was added to the etching gas at a ratio of 5% to the total of oxygen and BCl$_3$ gases, and as a result, the results indicated by a broken line in FIG. 10 were obtained. When the ratio of water vapor was higher than 5%, the B$_2$O$_3$ protective layer was deposited on the sidewalls as shown in FIG. 8, and the patterned lower layer had a good (vertical) edge profile. As can be seen from FIG. 10, the addition of water vapor further reduced the undercutting width, compared with the case of no addition in Example 1, because the water vapor addition accelerated the deposition of B$_2$O$_3$. Therefore, the water vapor addition enabled a reduction of the BCl$_3$ ratio, which restrains the lowering of the etching rate.

EXAMPLE 3

In the trilevel resist process explained in Example 1, the anisotropic etching of the planarizing lower layer was carried out by using an RIE apparatus instead of the ECR etching apparatus. The etching treatment was carried out under the following conditions:

RIE apparatus: Parallel-plate type
Etching gas: O$_2$ (40 cc/min) BCl$_3$(10 cc/min)
Pressure: 5×10 Torr
RF power: 400 W (13.56 MHz)
Substrate temperature: 100° C.

As the result of the etching, the planarizing lower layer 2 was selectively etched without undercutting as shown in FIG. 8, and the B$_2$O$_3$ protective layer 10 adhered to the sidewalls.

EXAMPLE 4

In the trilevel resist process explained in Examples 1 and 3, respectively, the anisotropic etching of the planarizing layer 2 was carried out by using the etching gas consisting of oxygen gas and a boron compound gas of BH$_3$, B$_2$H$_6$, BF$_3$ or BBr$_3$, in place of BCl$_3$. When the etching treatment was carried out under the following conditions, the lower layer 2 was selectively etched without undercutting, and the B$_2$O$_3$ protective layer 10 was deposited on the sidewalls, as shown in FIG. 8.

(1) Use of BH$_3$ gas

A. In the ECR etching apparatus, the gas pressure (5×10$^{-3}$ Torr), the flow rate of etching gas (O$_2$+BH$_3$, 10 cc/min), the substrate temperature (100° C.), the microwave power (1 kW), and the RF bias power (30 W, of 200 kHz) were the same as in Example 1, and the BH$_3$ ratio was in the range of from 5 to 20%.

B. In the ECR etching apparatus, the flow rate of the etching gas, the substrate temperature, the microwave power, and the RF bias power were the same as in Example 1, the pressure was 8×10$^{-3}$ Torr, and the BH$_3$ ratio range was from 10 to 40%.

C. In the RIE apparatus, the pressure (5×10$^{-2}$ Torr), the RF power (400 W), and the substrate temperature (100° C.) were the same as in Example 3, and the etching gas consisted of O$_2$ (40 cc/min) and 20% BH$_3$ (10 cc/min).

(2) Use of B$_2$H$_6$ (diborane) gas

A. In the ECR etching apparatus, the pressure, the flow rate, the substrate temperature, the microwave power, and the RF bias power were the same as in Example 1, and the B$_2$H$_6$ ratio range was from 5 to 20%.

B. In the ECR etching apparatus, the flow rate, the substrate temperature, the microwave power, and the RF bias power were the same as in Example 1, the pressure was 8×10$^{-3}$ Torr, and the B$_2$H$_6$ ratio range was from 10 to 40%.

C. In the RIE apparatus, the pressure, the RF power and the substrate temperature were the same as in Example 3, and the etching gas consisted of O$_2$ (40 cc/min) and 11% B$_2$H$_6$ (5 cc/min).

(3) Use of BF$_3$ (boron trifluoride) gas

A. In the ECR etching apparatus, the pressure, the flow rate, the substrate temperature, the microwave power, and the RF bias power were the same as in Example 1, and the BF$_3$ ratio range was from 10 to 40%.

B. In the ECR etching apparatus, the flow rate, the substrate temperature, the microwave power, and the RF bias power were the same as in Example 1, the pressure was 8×10$^{-3}$ Torr and the BF$_3$ ratio range was from 20 to 50%.

C. In the RIE apparatus, the pressure, the RF power, and the substrate temperature were the same as in Example 3, and the etching gas consisted of O$_2$ (40 cc/min) and 33% BF$_3$ (20 cc/min).

(4) Use of BBr$_3$ (boron tribromide) gas

A. In the ECR etching apparatus, the pressure, the flow rate, the substrate temperature, the microwave power, and the RF bias power were the same as in Example 1, and the BBr$_3$ ratio range was from 10 to 40%.

B. In the ECR etching apparatus, the flow rate, the substrate temperature, the microwave power, and the RF bias power were the same as in Example 1, The pressure was 8×10$^{-3}$ Torr, and the BBr$_3$ ratio range was from 10 to 40%.

C. In the RIE apparatus, the pressure, the RF power, and the substrate temperature were the same as in Example 3, and the etching gas consisted of O$_2$ (40 cc/min) and 33% BBr$_3$ (20 cc/min).

EXAMPLE 5

As shown in FIG. 1A, a stepped Al layer 1 was formed on a silicon substrate (not shown), and a planarizing lower layer 2 of novolak resist (OFPR-800) 2 μm thick was applied with a spin-coating method, to cover the Al layer 1, and was baked at 200° C. for 30 minutes. An intermediate layer 3 of SiO$_2$ 200 nm thick was formed on the flat surface of the lower layer 2 by a sputtering method, and then a resist upper layer 4 of OFPR-800 and of 1 μm thickness was applied on the SiO$_2$ intermediate layer 3 by a spin-coating method and was baked at 120° C. for 30 minutes. In this case, the material (siloxane resin) of the intermediate layer 3 of Example 1 was SiO$_2$.

Next, the resist upper layer 3 was exposed to light through a photomask having a predetermined pattern shape and was developed by an alkaline developer solution (NMD-3), to form a pattern as shown in FIG. 1B.

Using the patterned upper layer 4 as a mask, as shown in FIG. 1C, the SiO$_2$ intermediate layer 3 was selectively etched (patterned) by an RIE process using an etching gas of CF$_4$ and CHF$_3$.

Next, according to the present invention, using the patterned SiO$_2$ intermediate layer 3 as a mask, the planarizing layer 2 was selectively etched by an RIE process using an etching gas containing a metal halide gas, under the following conditions:

RIE apparatus: Parallel-plate type
Etching gas: O$_2$ (100 cc/min) TiCl$_4$ (10 cc/min)
Pressure: 3×10$^{-2}$ Torr
RF power: 400 W (13.56 MHz)
Substrate temperature: 100° C.

As a result of the etching, the upper layer 4 was completely removed, the planarizing lower layer 2 was selectively etched without undercutting, and a titanium compound (e.g., $Ti_xO_y$ protective layer 10) was deposited on the sidewalls as shown in FIG. 8. Thus, the etching treatment was performed in a completely anisotropic manner.

Thereafter, using the obtained mask pattern of the layers 2 and 3 as a mask, the Al layer 1 was etched by an RIE process using an etching gas of $BCl_3$, $Cl_2$ and $CiCl_4$, to form an Al pattern having accurate predetermined dimensions.

EXAMPLE 6

In the trilevel resist process explained in Example 5, the anisotropic etching of the planarizing lower layer was carried out by using an ECR etching apparatus (FIG. 7) instead of the RIE apparatus. The etching treatment was carried out under the following conditions:

Etching gas: $O_2$ (30 cc/min) $TiCl_4$ (5 cc/min)
Pressure in etching chamber: $1 \times 10^3$ Torr
Substrate temperature: 100° C.
(Support water-cooled at 20° C.)
Microwave power: 1 kW (2.45 GHz)
RF bias power (to support): 100 W (13.56 MHz)

As a result of the etching, the planarizing lower layer 2 was selectively and anisotropically etched without undercutting as shown in FIG. 8, and the titanium compound layer 10 was deposited on the sidewalls.

EXAMPLE 7

In the trilevel resist process explained in Examples 5 and 6, respectively, during the anisotropic etching of the lower layer 2, water vapor ($H_2O$) was added to the etching gas at a ratio of 5% to the total of $O_2$ and $TiCl_4$ gases. In both cases, the planarizing lower layer 2 was selectively etched without undercutting and the titanium compound layer 10 was deposited on the sidewalls as shown in FIG. 8. The deposited titanium compound layer 10 was a little thicker than that obtained in Examples 5 and 6, but as the titanium compound layer 10 was removed during the etching of the Al layer 1, the layer 10 did not cause a problem.

In Examples 5, 6 and 7, it is possible to replace $TiCl_4$ with $AlCl_3$, $AlBr_3$, $MoCl_3$ or $WF_6$, and to use any combination (mixture) thereof.

EXAMPLE 8

In the trilevel resist process explained in Example 5, the anisotropic etching of the lower layer 2 was carried out in the RIE apparatus using an etching gas consisting of oxygen ($O_2$) gas (100 cc/min) and $S_2Cl_2$ gas (10 cc/min), in place of the $TiCl_4$ gas. Namely, the gas mixture ($TiCl_4$) was replaced by $S_2Cl_2$ only. The other etching conditions were not changed.

As a result of the etching, the planarizing lower layer 2 was accurately patterned without undercutting as shown in FIG. 8, and a sulfur compound layer 10 was deposited on the sidewalls.

EXAMPLE 9

In the trilevel resist process explained in Example 6, the anisotropic etching of the lower layer 2 was carried out in the ECR etching apparatus using an etching gas consisting of oxygen ($O_2$) gas (30 cc/min) and $S_2Cl_2$ gas (5 cc/min) in place of the $TiCl_4$ gas. Namely, the gas mixture ($TiCl_4$) was replaced by $S_2Cl_2$ only. The other etching conditions were not changed.

As a result of the etching, the planarizing lower layer 2 was accurately patterned without undercutting as shown in FIG. 8, and a sulfur compound layer 10 was deposited on the sidewalls.

In Examples 8 and 9, it is possible to replace $S_2Cl_2$ with $SO_2$ or $SCl_2$, and to use any combination (mixture) thereof.

EXAMPLE 10

This example was carried out in accordance with a bilevel resist process. As shown in FIG. 3A, a planarizing lower layer 2 of novolak resist (OFPR-800) was applied on an Al Layer 1 formed on a silicon substrate (not shown), and was baked at 200° C. for 30 minutes, in a similar manner to that of Example 5. A resist upper layer 8 of a silicon-containing resist (e.g., chloromethyl polydiphenylsiloxane: SNR) was applied on the lower layer 2, by a spin-coating method and was baked at 80° C. for 30 minutes.

Next, the upper layer 8 was exposed to an electron beam and was developed by a developer solution of MIBK (methyl isobutyl ketone) and IPA (isopropyl alcohol), to form a pattern as shown in FIG. 3B.

Thereafter, using the patterned upper layer 8 as a mask, the planarizing lower layer 2 was selectively etched under the etching conditions given in Examples 5, 6, 8, and 9, respectively. In all cases, the lower layer 2 was accurately patterned without undercutting as shown in FIG. 8, and the compound layer 10 was deposited on the side walls.

EXAMPLE 11

In the trilevel resist process explained in Example 5, the anisotropic etching of the planarized lower layer 2 was carried out in the RIE apparatus by using an etching gas consisting of oxygen gas (100 cc/min) and $CiCl_4$ gas (10 cc/min), in place of the $TiCl_4$ gas. Namely, the gas mixture ($TICl_4$) was replaced by $SiCl_4$ only. The other etching conditions were not changed.

As a result of the etching, the lower layer 2 was accurately patterned without undercutting as shown in FIG. 8, and a silicon compound ($SiO_2$) layer 10 was deposited on the sidewalls.

EXAMPLE 12

In the trilevel resist process explained in Example 6, the anisotropic etching of the planarized lower layer 2 was carried out in the ECR etching apparatus using an etching gas having a pressure of $3 \times 10^{-2}$ Torr and consisting of oxygen gas (30 cc/min) and $CiCl_4$ gas (5 cc/min), in place of the $TiCl_4$ gas. The gas mixture ($TICl_4$) was replaced by $CiCl_4$ and the gas pressure was changed, but the other etching conditions were not changed.

As a result of the etching, the lower layer 2 was accurately patterned without undercutting as shown in FIG. 8, and a silicon compound ($SiO_2$) layer 10 was deposited on the sidewalls.

In Examples 11 and 12, it is possible to replace $CiCl_4$ with $SiF_4$ or $SiBr_4$, and to use any combination thereof. Furthermore, when a water vapor ($H_2O$) was added to the etching gas containing silicon halide gas, at a suitable ratio to the total flow rate of the etching gas, the deposition of the sulfur compound protective layer on the sidewalls was accelerated.

EXAMPLE 13

Figure 12:
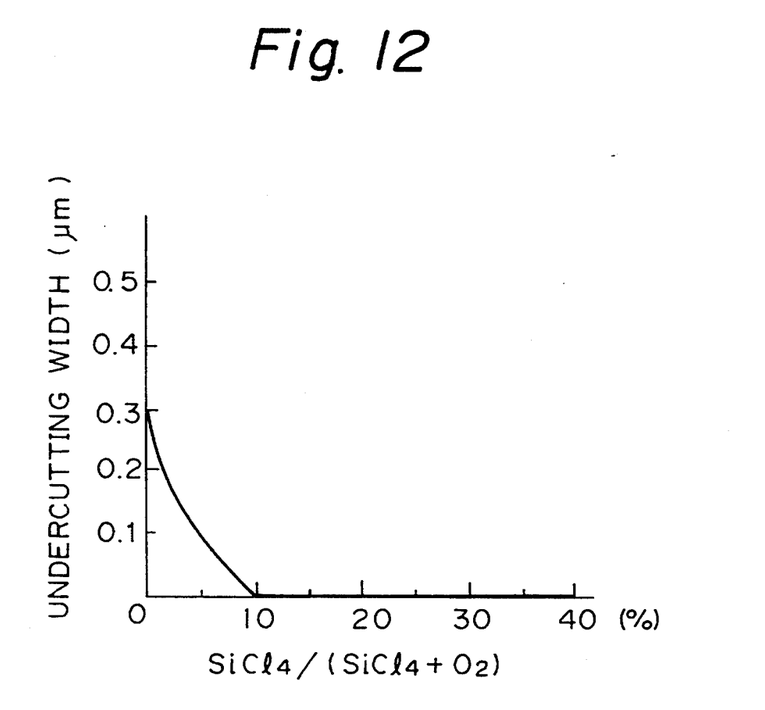
FIG. 12 is a graph showing the undercutting width of the lower layer in relation to the ratio of CiCl$_4$ to the total gas.

In the trilevel resist process explained in Example 1, the anisotropic etching of the planarizing (novolak) lower layer 2 was carried out in the ECR etching apparatus under the same conditions as in Example 1, except for the use of $CiCl_4$ gas instead of $BCl_3$ gas. The parameter of $CiCl_4$ ratio to the total of $O_2$ and $CiCl_4$ [$SiCl_4/(O_2+SiCl_4)$] was varied and the etching treatments were carried out to obtain the results shown in FIG. 12. As can be seen from FIG. 12, where the $CiCl_4$ ratio is 10% or more, undercutting is prevented by the deposition of $SiO_2$ on the sidewalls.

It will be obvious that the present invention is not restricted to the above-mentioned embodiments and that many variations are possible for persons skilled in the art without departing from the scope of the invention. For example, the compound gas added to oxygen gas for a formation of the etching gas may be a gas mixture of any combination of the above-mentioned gases, e.g., $BCl_3+CiCl_4$, $BCl_3+SO_2$, and so on.

We claim:

1. A process of forming a resist mask pattern comprising the steps of:
    forming a resist layer of organic material on a layer to be etched;
    forming a mask layer having at least one throughhole on said resist layer; and
    selectively and anisotropically etching said resist layer by using said mask layer as a mask and by using a mixed gas which includes a compound gas and an etching gas of oxygen gas in a plasma condition to form an opening having sidewalls in said resist layer, wherein said compound gas is composed of at least one element selected from the group consisting of B, Si, Ti, Al, Mo, W and S, so as to form an oxide protective layer on said sidewalls of said opening in which said protective layer is at least partially composed of material of said compound gas.

2. A process according to claim 1, wherein said resist layer is a planarizing lower layer used in a multilevel resist process.

3. A process according to claim 1, wherein the ratio of the compound gas to the total of the oxygen gas and the compound gas is from 2 to 50%.

4. A process according to claim 1, wherein 1 to 20% of a water vapor to the total of the oxygen gas and compound gas is added to the etching gas.

5. A process according to claim 1, wherein said compound gas is at least one boron compound gas selected from the group consisting of $BCl_3$, $BH_3$, $B_2H_6$, $BF_3$ and $BBr_3$.

6. A process according to claim 1, wherein said compound gas is at least one metal compound gas selected from the group consisting of $TiCl_4$, $AlCl_3$, $AlBr_3$, $AlI_3$, $MoCl_4$ and $WF_6$.

7. A process according to claim 1, wherein said compound gas is at least one sulfur compound gas selected from the group consisting of $SO_2$, $S_2Cl_2$ and $SCl_2$.

8. A process according to claim 1, wherein said compound gas is at least one silicon halide gas selected from the group consisting of $SiF_4$, $CiCl_4$ and $SiBr_4$.

9. A process according to claim 1, wherein said dry-etching step is performed by a reactive ion etching process.

10. A process according to claim 8, wherein said reactive ion etching process is performed at an etching gas pressure of from 0.01 to 0.2 Torr, a substrate temperature of from $-50°$ to $100°$ C. and a power density of from 1 to 3 $W/cm^3$.

11. A process according to claim 1, wherein said dry-etching step is performed by an electron cyclotron resonance plasma etching process.

12. A process according to claim 10, wherein said electron cyclotron resonance plasma etching process is performed at an etching gas pressure of from $1.0\times10^{-3}$ to $1.0\times10^{-2}$ Torr, a substrate temperature of from $-50$ to $100°$ C., a microwave power of from 0.2 to 1.0 kW, and a bias voltage of from $-100$ to $-400$ V.

13. A method of selectively etching a layer covered with a resist mask pattern, characterized in that said resist mask pattern is formed in accordance with the process of claim 1.

14. A process according to claim 10, wherein a ratio of said compound gas to a total of the oxygen and the compound gas, is in a range from 2% to 50%.

15. A process according to claim 10, wherein a ratio of said compound gas to a total of the oxygen and the compound gas, is in a range from 10% to 30%.

* * * * *